United States Patent
Kelly et al.

(10) Patent No.: US 10,912,217 B2
(45) Date of Patent: Feb. 2, 2021

(54) ENCLOSURE FOR ELECTRICAL EQUIPMENT

(71) Applicant: ENCLOSURES UNLIMITED INC., Libertyville, IL (US)

(72) Inventors: Paul Kelly, Libertyville, IL (US); John E. Hanley, Nashotah, WI (US); Jeffrey S. Bopp, Mundelein, IL (US); John Taveirne, Third Lake, IL (US); Steve C. Wolfe, Mundelein, IL (US)

(73) Assignee: Enclosures Unlimited Inc., Libertyville, IL (US)

( * ) Notice: Subject to any disclaimer, the term of this patent is extended or adjusted under 35 U.S.C. 154(b) by 0 days.

(21) Appl. No.: 16/547,057

(22) Filed: Aug. 21, 2019

(65) Prior Publication Data

US 2020/0068736 A1    Feb. 27, 2020

Related U.S. Application Data

(60) Provisional application No. 62/721,058, filed on Aug. 22, 2018.

(51) Int. Cl.
  *H05K 5/03* (2006.01)
  *H05K 5/02* (2006.01)

(52) U.S. Cl.
  CPC ............. *H05K 5/03* (2013.01); *H05K 5/0204* (2013.01); *H05K 5/0217* (2013.01); *H05K 5/0226* (2013.01)

(58) Field of Classification Search
  CPC ..................................................... H05K 5/03
  USPC ........................................................ 174/562
  See application file for complete search history.

(56) References Cited

U.S. PATENT DOCUMENTS

| 3,444,345 A | 5/1969 | Mackiewicz |
| 4,445,622 A | 5/1984 | Sideri |
| 5,194,691 A | 3/1993 | McIlwraith |
| 5,292,189 A | 3/1994 | Lau et al. |
| 5,536,079 A | 7/1996 | Kostic |
| 5,547,272 A | 8/1996 | Paterson et al. |
| 5,682,017 A | 10/1997 | Marrotte |

(Continued)

OTHER PUBLICATIONS

Sonderhoff Chemicals GMBH, "Fermapor K31 A-9230-2-VP / K31 B-4 Technical Data Sheet," <https://www.scandiloc.dk/datablade/pursealing/FermaporK31/> web page publicly available at least as early as Jul. 31, 2018.

(Continued)

*Primary Examiner* — Stanley Tso
(74) *Attorney, Agent, or Firm* — Michael Best & Friedrich LLP

(57) ABSTRACT

A protective enclosure for electrical components. A body defines a front opening, a first end opening, and a second end opening, wherein the body includes a front panel, a rear panel, and two side panels, all of which are formed at least in part by a single material sheet, without welding. A door is coupled to the body to selectively close the front opening. First and second end caps are sealingly coupled to the body around the first and second end openings. A first ledge, formed by the single material sheet, surrounds the first end opening and lies in a first plane perpendicular to the front, rear, and side panels. A second ledge, formed by the single material sheet, surrounds the second end opening and lies in a second plane parallel to the first plane.

19 Claims, 16 Drawing Sheets

(56) References Cited

U.S. PATENT DOCUMENTS

| | | | |
|---|---|---|---|
| 5,886,868 A | 3/1999 | White et al. | |
| 5,914,460 A | 6/1999 | Mowery et al. | |
| 5,971,511 A | 10/1999 | Diebel et al. | |
| 6,000,464 A | 12/1999 | Scafidi et al. | |
| 6,110,086 A | 8/2000 | Moran, Jr. | |
| 6,374,912 B1 | 4/2002 | LaGrotta et al. | |
| 6,605,777 B1 | 8/2003 | Anderson et al. | |
| 6,657,861 B2 | 12/2003 | Irmer | |
| 6,877,827 B2 | 4/2005 | Holighaus et al. | |
| 6,879,483 B2 | 4/2005 | Johnson et al. | |
| 6,881,898 B2 | 4/2005 | Baker et al. | |
| 6,924,572 B2 | 8/2005 | Schmidt et al. | |
| 7,068,516 B2 | 6/2006 | Chan et al. | |
| 7,071,409 B2 | 7/2006 | Richard et al. | |
| 7,075,003 B2 | 7/2006 | Johnson et al. | |
| 7,263,869 B2 | 9/2007 | Durney et al. | |
| 7,276,659 B2 | 10/2007 | Thrift et al. | |
| 7,532,482 B2 | 5/2009 | Miller et al. | |
| 8,022,319 B2 | 9/2011 | Lament et al. | |
| 8,148,648 B2 | 4/2012 | Nelson et al. | |
| 8,456,814 B2 | 6/2013 | Gerovac et al. | |
| 8,599,540 B2 | 12/2013 | Fernandez | |
| 8,702,184 B2 | 4/2014 | Lakoduk et al. | |
| 8,802,978 B2 | 8/2014 | Adducci et al. | |
| 8,891,228 B2 | 11/2014 | Gerovac | |
| 9,066,586 B2 | 6/2015 | Skovira | |
| 9,196,430 B2 | 11/2015 | Li et al. | |
| 9,247,658 B2 | 1/2016 | McWilliams, Jr. et al. | |
| 9,272,821 B2 | 3/2016 | Manahan et al. | |
| 9,455,560 B1 | 9/2016 | Jopek et al. | |
| 9,553,435 B2 | 1/2017 | Manahan et al. | |
| 9,559,501 B2 | 1/2017 | Lindholdm et al. | |
| 9,603,269 B2 | 3/2017 | Omari et al. | |
| 9,678,292 B2 | 6/2017 | Landry et al. | |
| 9,745,794 B2 | 8/2017 | Ellingson | |
| 2001/0033379 A1* | 10/2001 | Huhta | G01N 21/01 356/402 |
| 2002/0153373 A1 | 10/2002 | Traut et al. | |
| 2003/0090182 A1 | 5/2003 | Johnson | |
| 2006/0037773 A1 | 2/2006 | Castaldo et al. | |
| 2006/0119239 A1 | 6/2006 | Werwick | |
| 2007/0175648 A1 | 8/2007 | Francisqini | |
| 2009/0100894 A1 | 4/2009 | Durney et al. | |
| 2011/0147037 A1 | 6/2011 | Tee et al. | |
| 2012/0055924 A1* | 3/2012 | Roth | H02B 1/01 220/200 |
| 2012/0212883 A1* | 8/2012 | Hargreaves | H05K 5/04 361/679.01 |
| 2013/0264146 A1* | 10/2013 | Nason | E06B 5/20 181/290 |
| 2014/0001932 A1 | 1/2014 | Westby et al. | |
| 2014/0124259 A1 | 5/2014 | Dean et al. | |
| 2016/0049778 A1 | 2/2016 | Moench | |
| 2016/0086710 A1* | 3/2016 | Zweifel | H02G 3/14 174/520 |
| 2016/0113126 A1* | 4/2016 | Guo | A47B 47/0025 312/326 |
| 2016/0206492 A1* | 7/2016 | di Girolamo | A61G 10/026 |
| 2016/0238303 A1* | 8/2016 | Olson | F25D 23/063 |
| 2016/0368655 A1 | 12/2016 | Drechsler et al. | |
| 2017/0261184 A1 | 9/2017 | Oksengendler et al. | |

OTHER PUBLICATIONS

Sonderhoff Chemicals GMBH, "Fermapor K31 Brochure," <https://www.sonderhoff.com/fileadmin/assets/images/infopool/Broschueren/sonderhoff_fermapork31_en.pdf> web page publicly available at least as early as Jul. 31, 2018.

Forest City Technologies Inc., "Rimlex 620 BNA Product Data Sheet," publicly available at least as early as Aug. 16, 2018.

Anochrome Group, "Rimlex 620B Technical Data Sheet," publicly available at least as early as Aug. 16, 2018.

Emhart Teknologies, "PoP Closed End Rivets 5056 Aluminum Body/Steel Mandrel—Domed Head—Finish: Plain/Protective Coating," publicly available at least as early as Aug. 16, 2018.

Rampf, "RAKU-PUR Foam Gaskets," publicly available prior to Aug. 22, 2018.

* cited by examiner

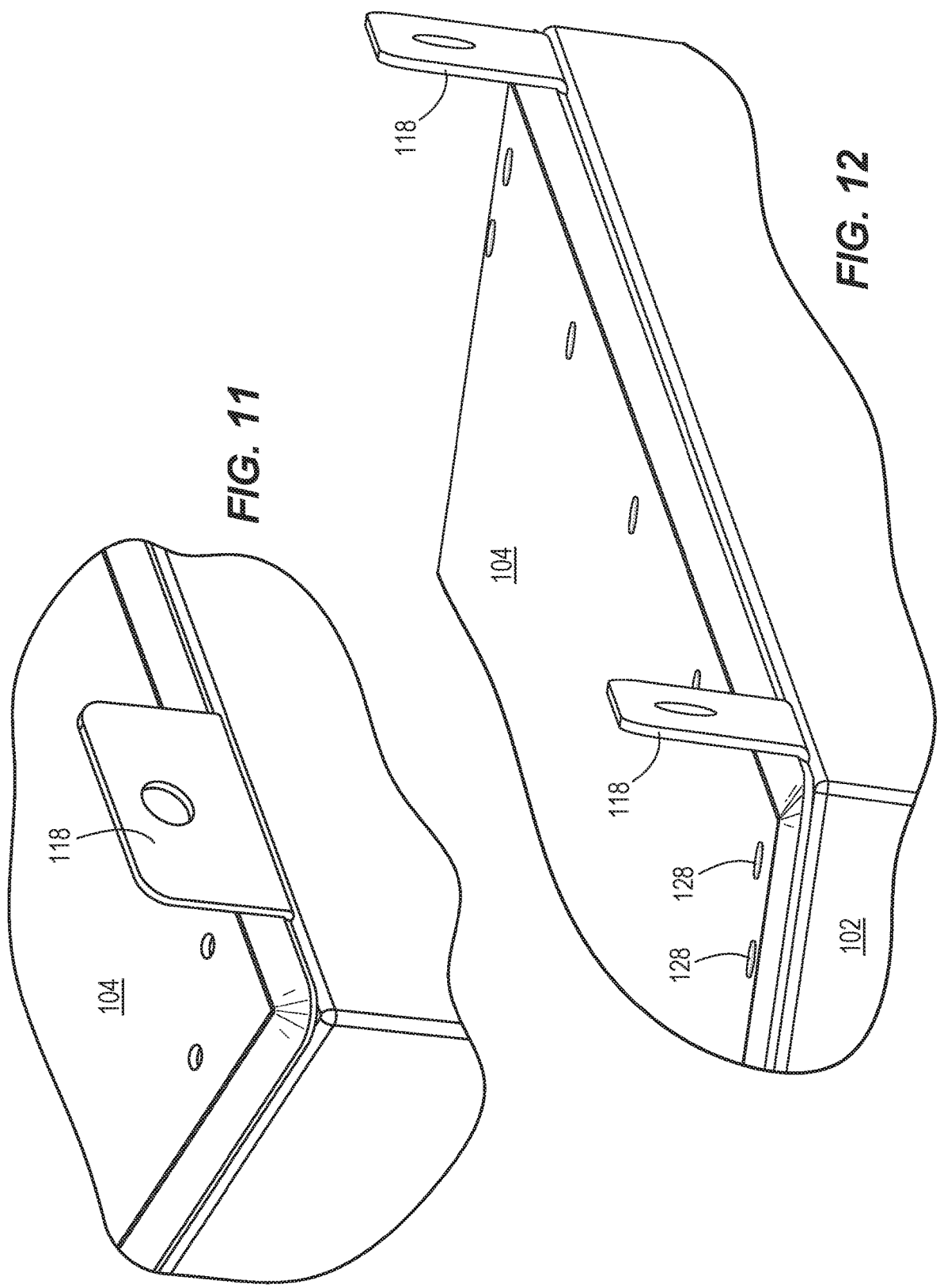

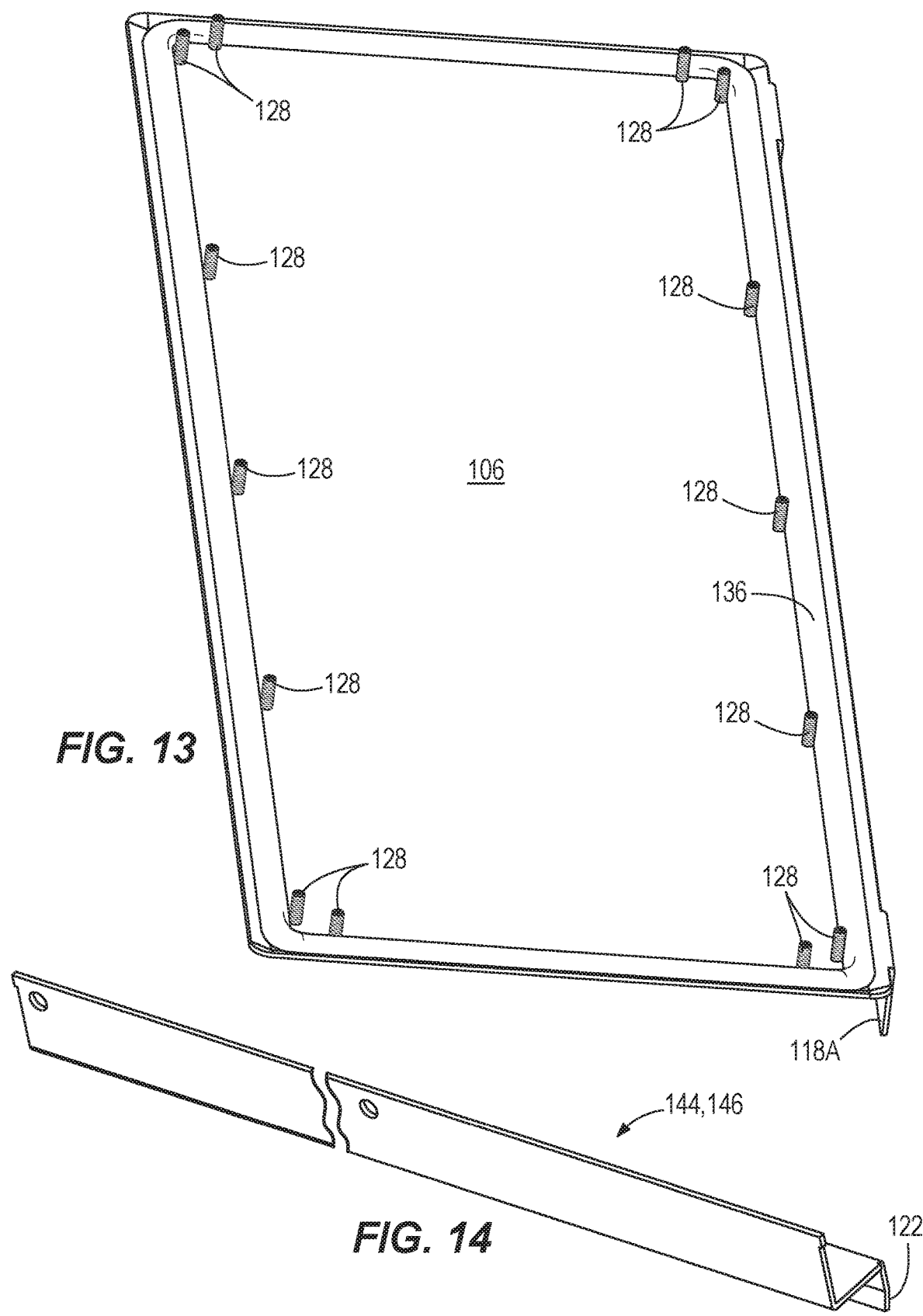

ENCLOSURE FOR ELECTRICAL EQUIPMENT

CROSS-REFERENCE TO RELATED APPLICATIONS

This application claims priority to U.S. Provisional Patent Application No. 62/721,058, filed on Aug. 22, 2018, the entire contents of which are incorporated by reference herein.

BACKGROUND

This disclosure relates to industrial enclosures suitable for housing electrical components, control systems, and the like.

SUMMARY

In one aspect, the invention provides a protective enclosure for electrical components. A body of the enclosure defines a front opening, a first end opening, and a second end opening. The body includes a front panel, a rear panel, and two side panels, all of which are formed at least in part by a single material sheet, without welding. A door is coupled to the body to selectively close the front opening. A first end cap sealingly couples to the body around the first end opening, and a second end cap sealingly couples to the body around the second end opening. A first ledge, formed in part by the single material sheet, surrounds the first end opening and lies in a first plane perpendicular to the front, rear, and side panels. A second ledge, formed in part by the single material sheet, surrounds the second end opening and lies in a second plane parallel to the first plane.

In another aspect, the invention provides a protective enclosure for electrical components. A body of the enclosure defines a front opening and a first end opening. The body includes a front panel, a rear panel, and two side panels, all of which are formed at least in part by a single material sheet, without welding. A door is coupled to the body to selectively sealingly close the front opening. A first end cap is sealingly coupled to the body around the first end opening. The first end cap includes a central portion and an edge portion extending around the central portion to define a perimeter of the first end cap. The edge portion is pitched at an acute angle from the central portion. A peripheral gasket is provided between the first end cap and the first end opening of the body, the gasket positioned peripherally outboard of a plurality of mechanical fasteners securing the first end cap to the body.

BRIEF DESCRIPTION OF THE DRAWINGS

FIG. 11 is a detail perspective view of the top cap in position on a top flange of the enclosure body.

FIG. 12 is a detail perspective view of a rear edge portion of the upper end cap in position on the enclosure body.

FIG. 13 is a perspective view of a bottom cap.

FIG. 14 is a perspective view of a cross member of the enclosure body.

DETAILED DESCRIPTION

Figure 1:
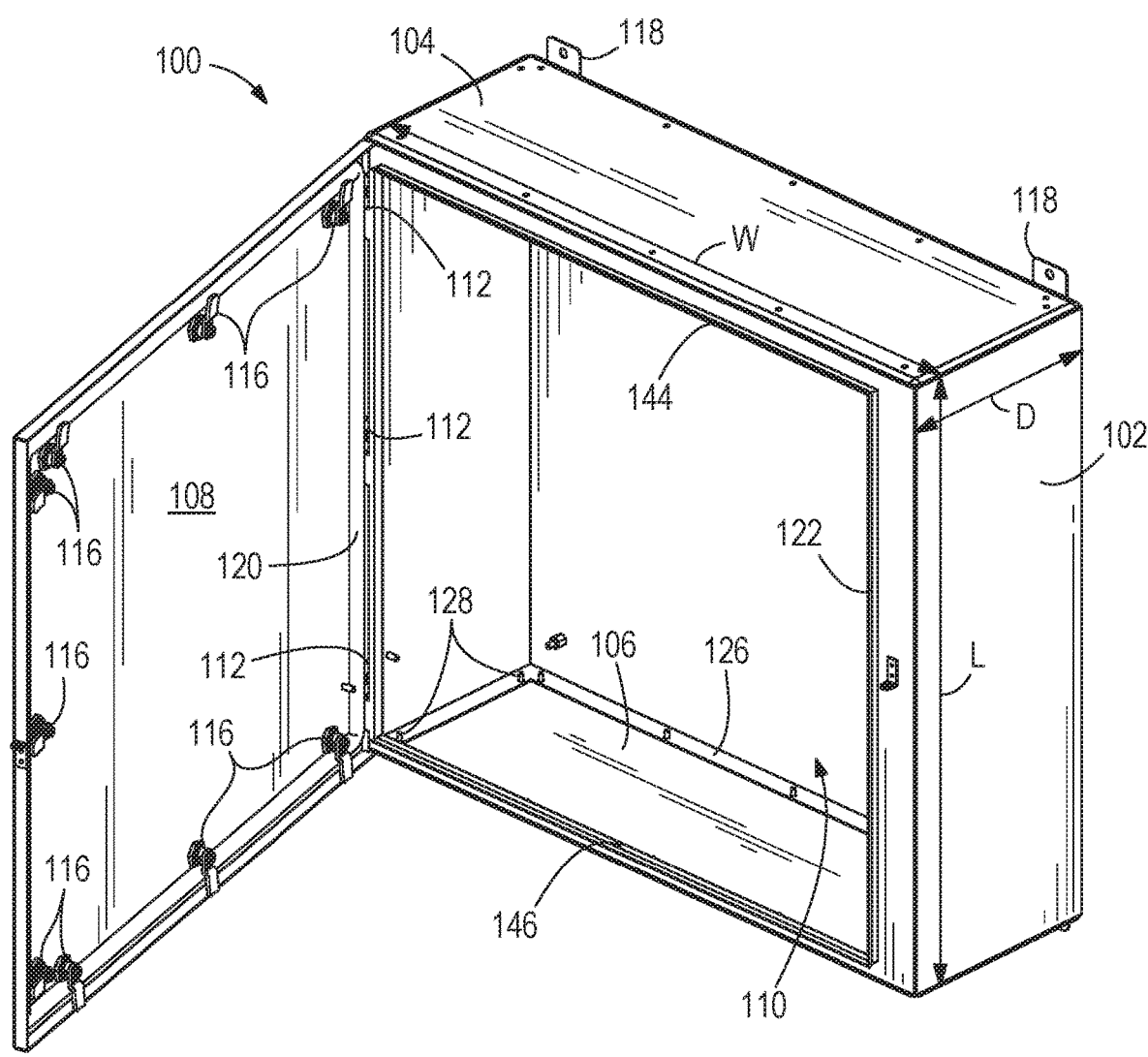
FIG. 1 is a perspective view of an enclosure according to a first embodiment of the present disclosure. A door of the enclosure is shown open.
Figure 2:
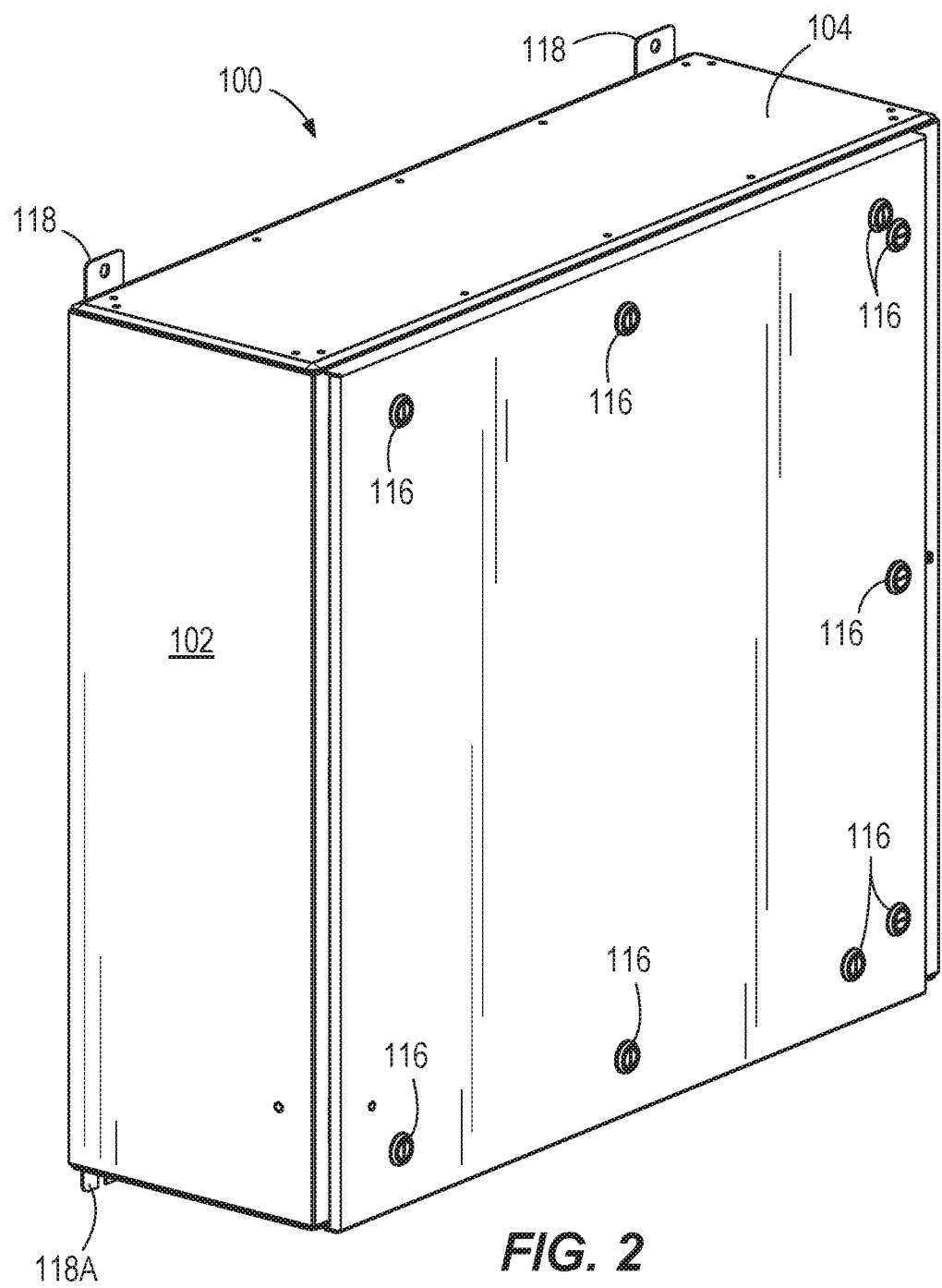
FIG. 2 is a perspective view of the enclosure of FIG. 1. The door of the enclosure is shown closed.
Figure 3:
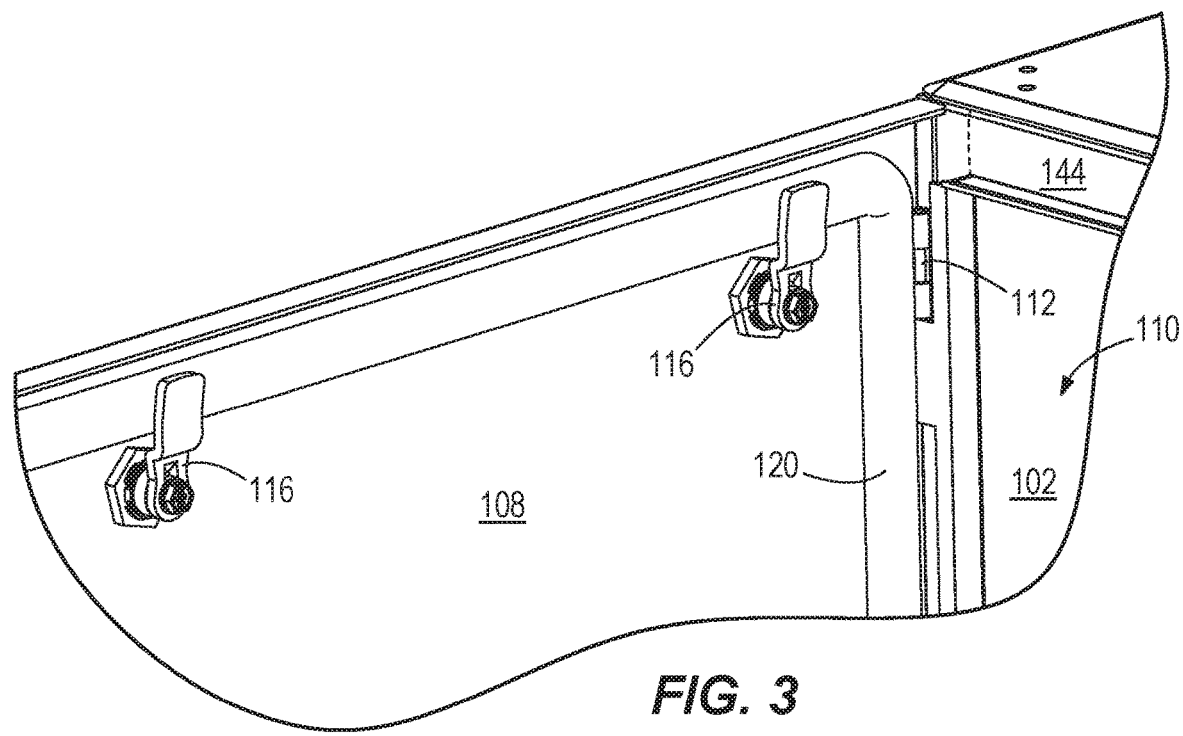
FIG. 3 is a detail view of a top edge of the enclosure as shown in FIG. 1.
Figure 4:
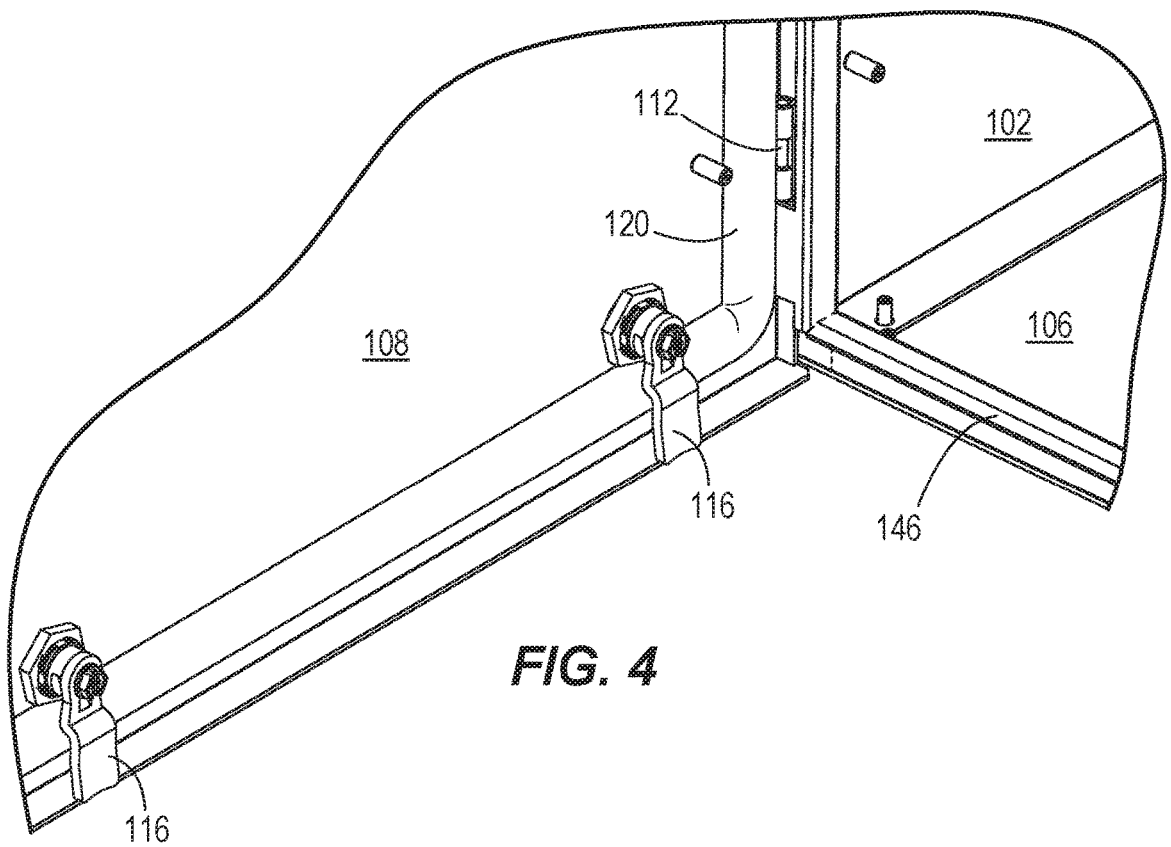
FIG. 4 is a detail view of a bottom edge of the enclosure as shown in FIG. 1.
Figure 6:
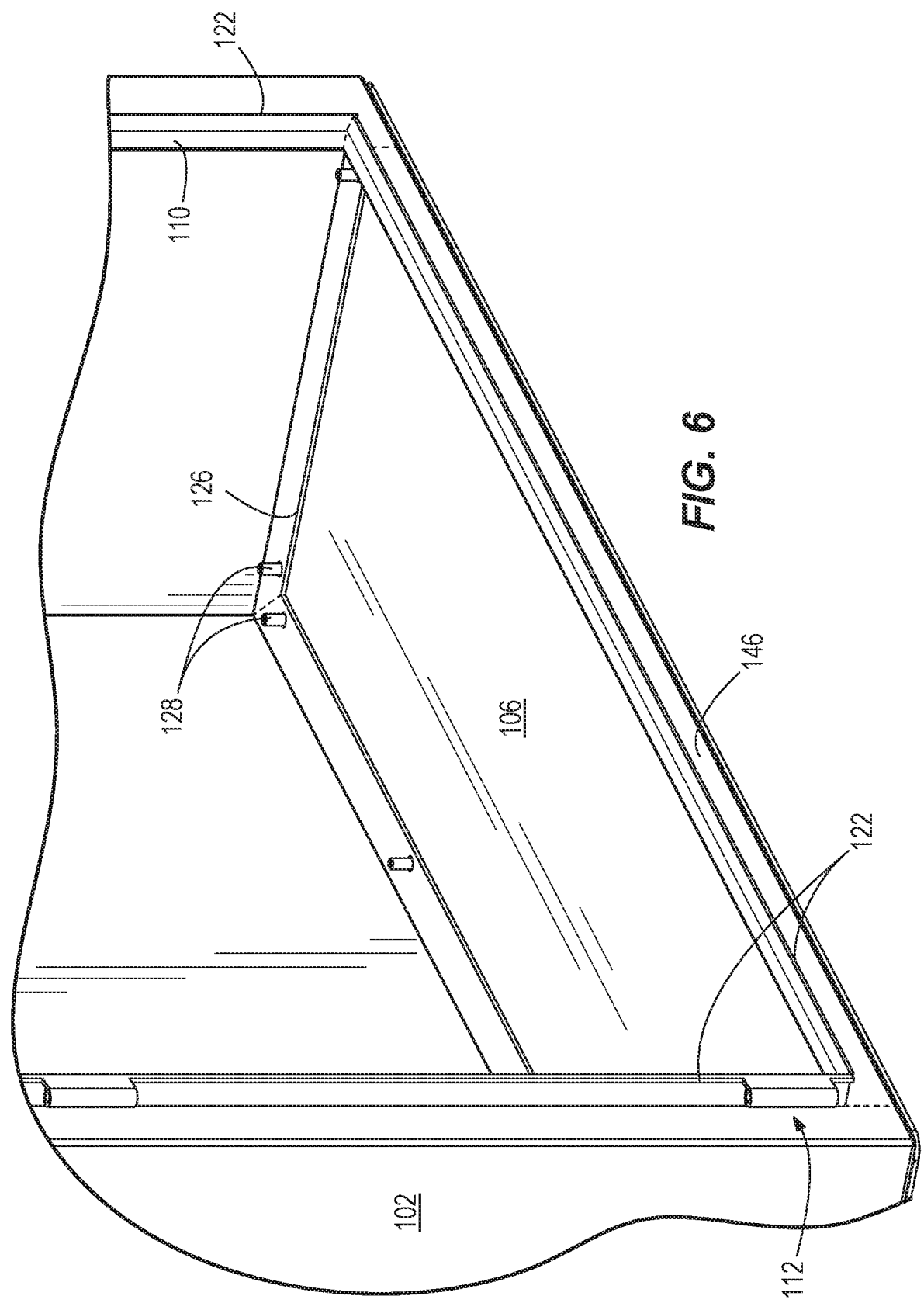
FIG. 6 is a perspective view of a lower portion of the enclosure with the door removed.
Figure 8:
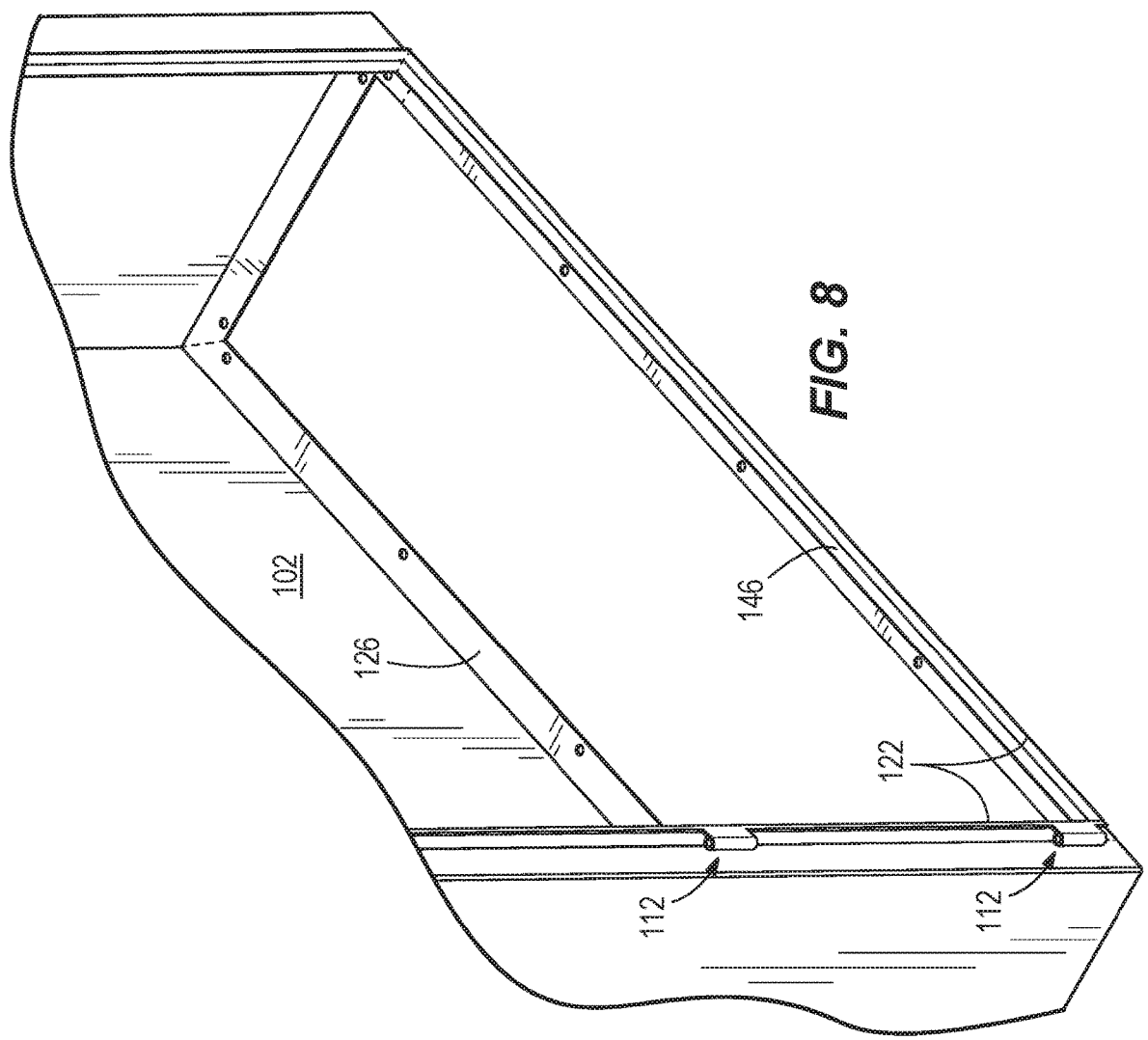
FIG. 8 is a perspective view of a lower portion of the enclosure with the door and lower end cap removed.
Figure 7:
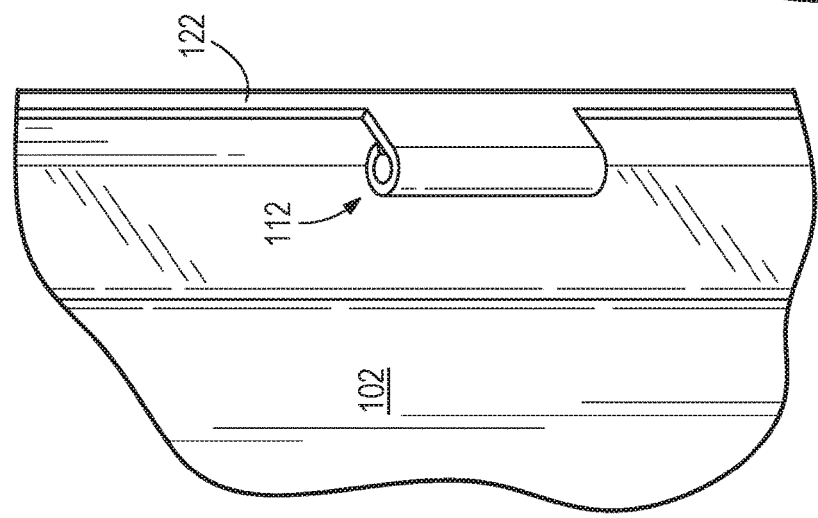
FIG. 7 is a detail view of a central one of the hinges on the enclosure body.

FIGS. 1 and 2 illustrate an enclosure 100 having a body 102, upper and lower end caps 104, 106, and a door 108 for selectively opening and closing an opening 110 formed in the body 102. The enclosure 100 is formed generally as a rectangular (or square) prism, defining a length L, a width W, and a depth D. The enclosure 100 is easily adapted to constructions having different H:W:D combinations, and it will be understood that the drawings illustrate only one such exemplary combination. The body 102 is formed to include a front panel, a back panel, and two side panels that span between the front and back panels, and the opening 110 is formed in the front panel, which spans the length and width dimensions L, W. As discussed further below, the panels of the body 102 are sheet-formed, and the enclosure 100 as a whole is void of any separate frame supporting the panels of the body 102. The door 108 is shown open in FIG. 1, in which configuration access is provided to an interior space of the enclosure 100. With the door 108 closed, as in FIG. 2, the interior space is sealed from the outside environment as discussed in further detail below. The door 108 is hingedly attached to the body 102 in the illustrated construction to allow the door 108 to pivot or swing with respect to the body 102. The attachment can include any number of hinges, or a continuous hinging along the length of the joint between the body 102 and the door 108. As shown, the enclosure 100 includes a first or upper hinge 112 (FIG. 3), a second or lower hinge 112 (FIG. 4), and a third or intermediate hinge 112 between the first and second hinges 112. Each hinge 112 can be formed in part by an integral shaped extension of the body 102 or the door 108, respectively, which interlace with each other and receive a hinge pin. FIGS. 6-8 illustrate the hinge formation feature in further detail, with respect to the body 102. The door 108 can be secured to or released from the body 102 by one or more latches or hasps 116, e.g., quarter-turn latches as shown. The illustrated latches 116 are provided along the top edge, the bottom edge, and the free edge of the door 108 spaced across from the hinges 112, e.g., each edge having multiple latches 116. However, the enclosure 100 can have a variety of alternate latch arrangements. Mounting brackets 118 can be provided at various locations along the enclosure 100 to facilitate attachment of the enclosure 100 to a fixed building structure or machine, for example. Each mounting bracket 118 can include an opening in the form of a hole, slot, etc., although other mounting structures are optional.

In some constructions, the enclosure 100 conforms to one or more industry standards for protecting its contents from intrusion of foreign matter such as water, dust, dirt, etc. Such standards may be set by the National Electrical Manufacturers Association (NEMA), International Electrotechnical Commission (IEC), or Underwriters Laboratories, Inc. (UL). Exemplary NEMA ratings include Type 1, Type 3, Type 3R, Type 4, Type 12, etc., and exemplary UL ratings include UL50E. Such ratings require testing of water-tightness, which simulate the ability for the enclosure to maintain a water-tight seal when exposed to windblown rain, splashing, hose spray, sleet, etc. Thus, for the purposes of this disclosure water-tight shall refer to being sealed from water intrusion to meet at least one such rating of NEMA, IEC, or UL. In order for the enclosure 100 to meet such a rating, the door 108 must seal to the body 102, and thus, a gasket 120 is provided (FIG. 1).

The gasket 120 is illustrated as being provided on the door 108 for selective contact with the body 102 when the door 108 is closed. However, the gasket 120 is provided on the body 102 in other constructions. Likewise, it is conceived to have gaskets on both the body 102 and the door 108. The gasket 120 is formed from any suitable sealing material and may be a compressible material softer than the material of the body 102 and the door 108 (e.g., sheet metal). One exemplary gasket material is a flexible polyurethane foam material. Such a foam material can be an addition-curing two-component system, for example a FERMAPOR® K31 product available from Sonderhoff Chemicals GmbH, Köln, Germany. In other constructions, the gasket 120 can be a RAKU-PUR® foam gasket product (e.g., RAKU-PUR 32-3250) available from RAMPF Giessharze GmbH, Grafenberg, Germany. The gasket 120 can be provided on the enclosure 100 using formed-in-place foam gasket (FIPFG) technology. In one construction, the gasket 120 is 0.500 in. wide and 0.250 in. high. As illustrated in FIG. 1, the gasket 120 is a peripheral gasket extending in a loop and conforming to the shape of the opening 110. At the opening 110, the body 102 includes a raised lip or ridge 122 that is aligned for contacting the gasket 120 when the door 108 is closed. Pressure on the gasket 120 can be maintained by the closed latches 116.

Figure 5:
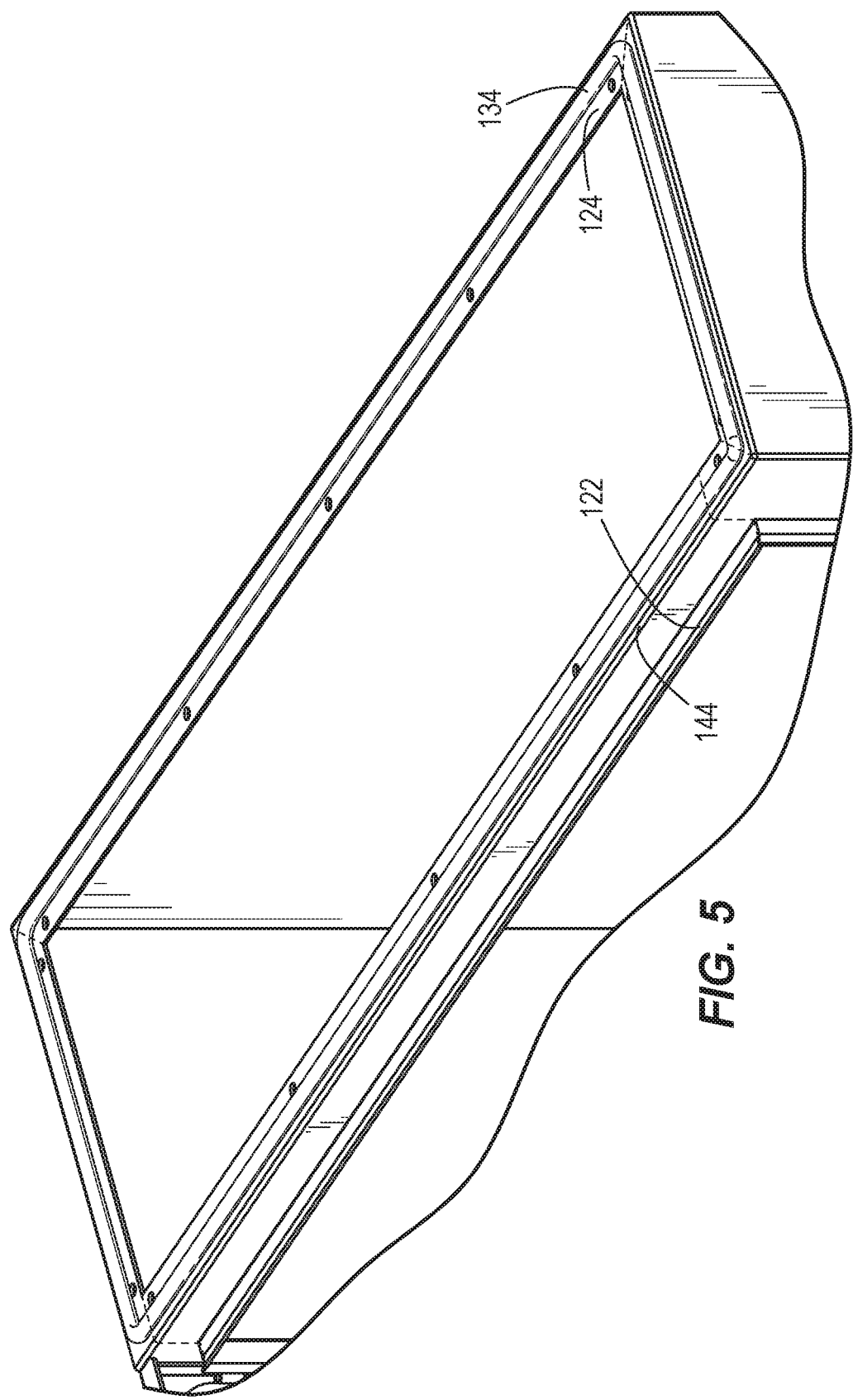
FIG. 5 is a perspective view of an upper portion of the enclosure with the upper end cap removed.

As best shown in FIGS. 5, 6, and 8, the body 102 includes a first or upper ledge 124 for receiving the upper end cap 104 at the top end of the body 102 and a second or lower ledge 126 for receiving the lower end cap 106 at the bottom end of the body 102. Each ledge 124, 126 is formed as a peripheral flange about the width and depth dimensions of the enclosure 100. The ledges 124, 126 lie in respective parallel planes at the ends of the enclosure 100, both planes being perpendicular to the front, rear, and side panels. The ledges 124, 126 can be provided with a plurality of dispersed apertures as shown for connection of the upper and lower end caps 104, 106. For example, the upper and lower end caps 104, 106 can be attached to the respective ledges 124, 126 with individual fasteners 128 (FIG. 6), e.g., threaded fasteners or rivets, including closed-end self-sealing rivets. The rivets can be AD H series POP® rivets available from Emhart Teknologies, Shelton, Conn., for example AD 55 H. The rivets may have a polyurethane resin seal incorporated therewith (e.g., Rimlex® 620B available from Anochrome Group, Wolverhampton, UK). Furthermore, a top gasket 134 is provided between the upper end cap 104 and the upper ledge 124, and a bottom gasket 136 is provided between the lower end cap 106 and the lower ledge 126, for sealing of the caps to the body 102. The gaskets 134, 136 can be of a similar construction to the gasket 120 described above. The gaskets 134, 136 can be provided on the ledges 124, 126 (as shown in FIG. 5) or on the caps 104, 106, respectively. The placement of the gaskets 134, 136, each of which is formed as a continuous loop, is outboard of the fasteners 128 such that the fastener apertures are within the sealed space created by the gaskets 134, 136. There is no welding provided in the attachment of the upper and lower end caps 104, 106 to the body 102.

Figure 9:
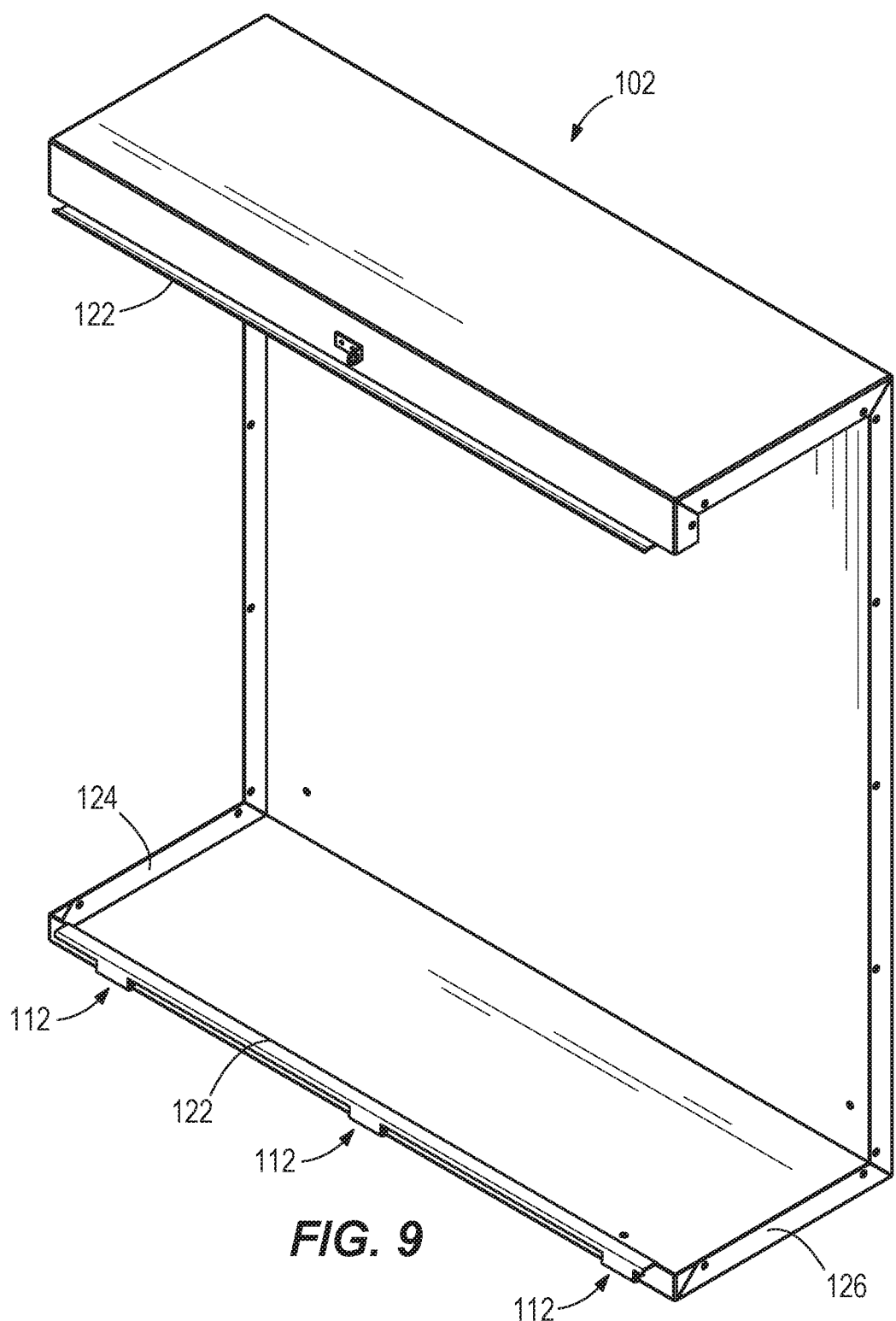
FIG. 9 is a perspective view of the enclosure body after initial forming and prior to attachment of upper and lower cross members.
Figure 10A:
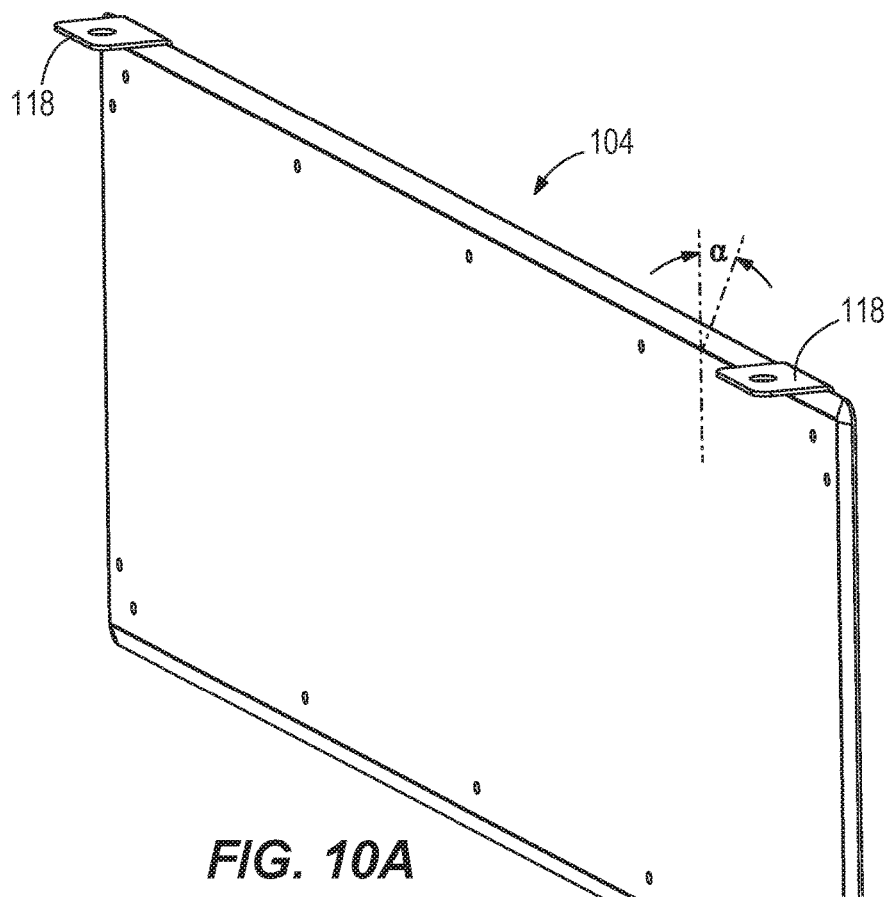
FIG. 10A is a first perspective view of the upper end cap.
Figure 10B:
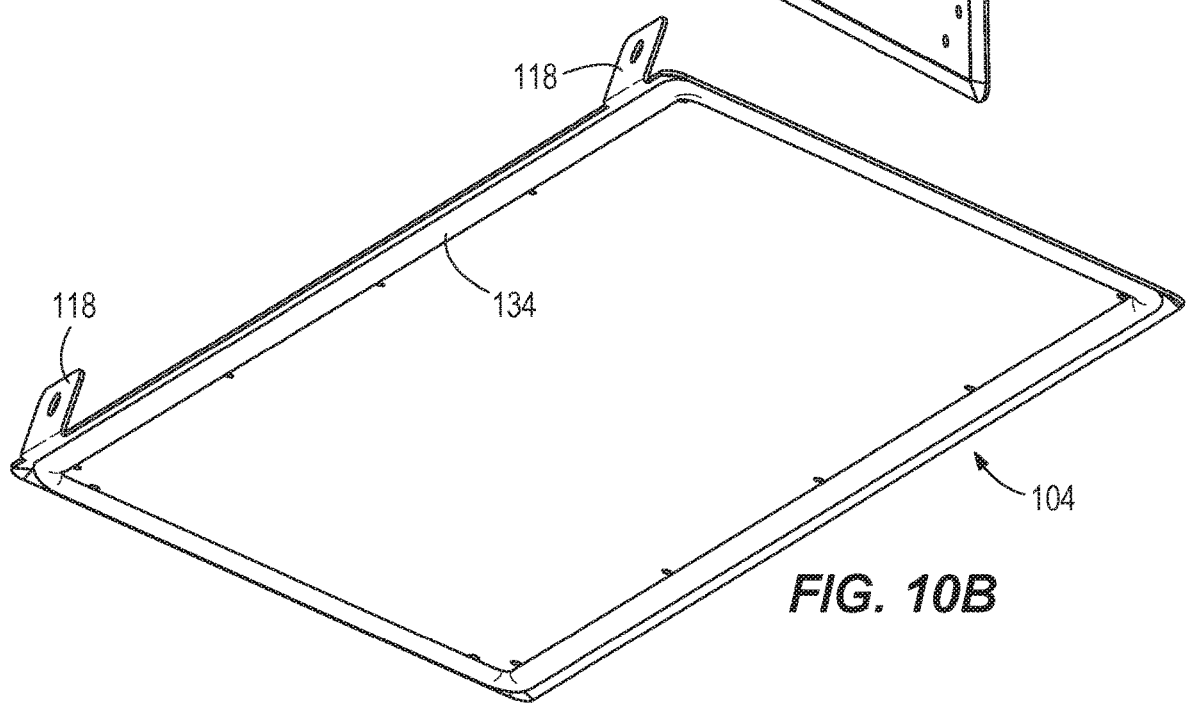
FIG. 10B is a second perspective view of the upper end cap.
Figure 15:
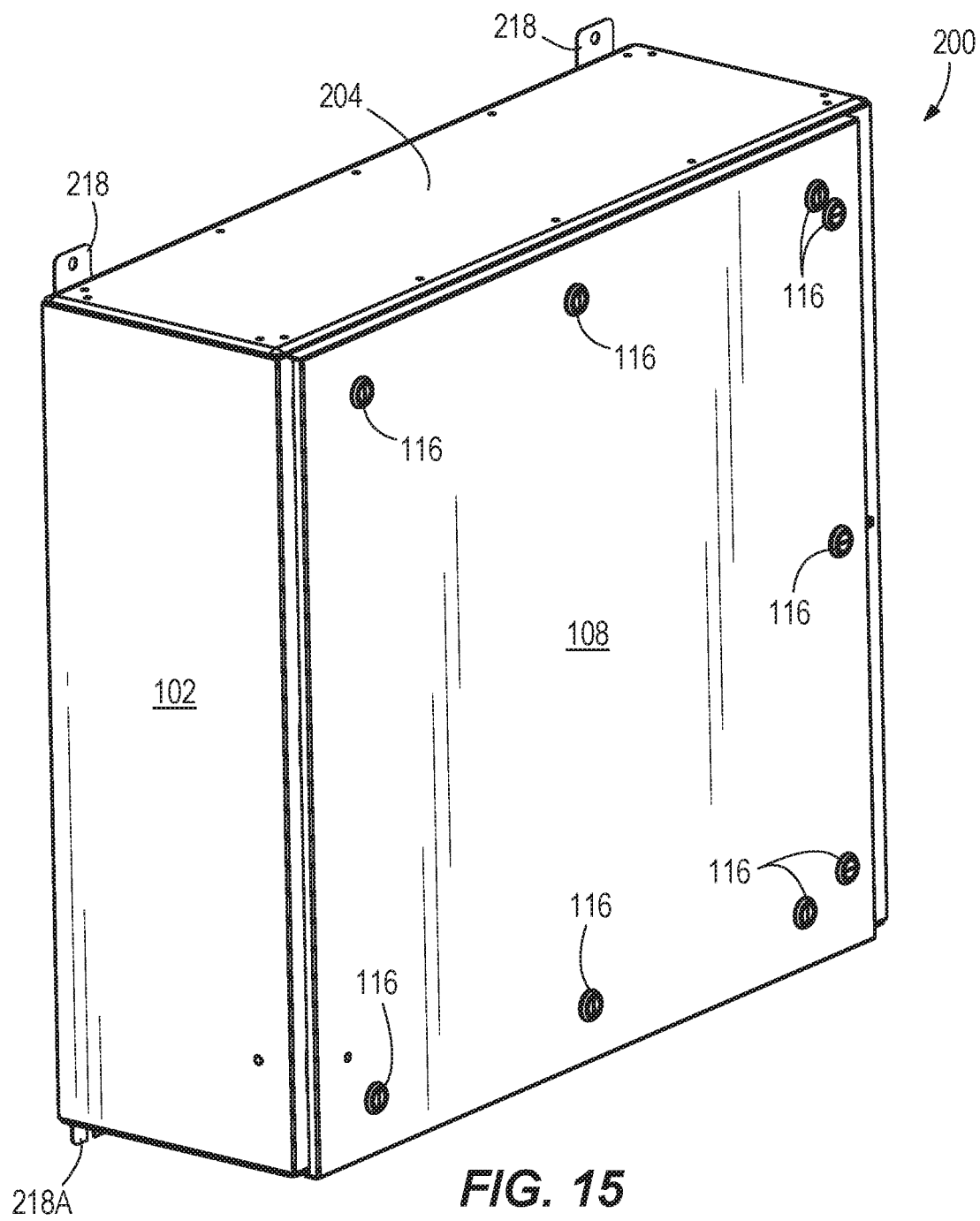
FIG. 15 is a first perspective view of an enclosure having an enclosure body with integral upper and lower mounting flanges.
Figure 16:
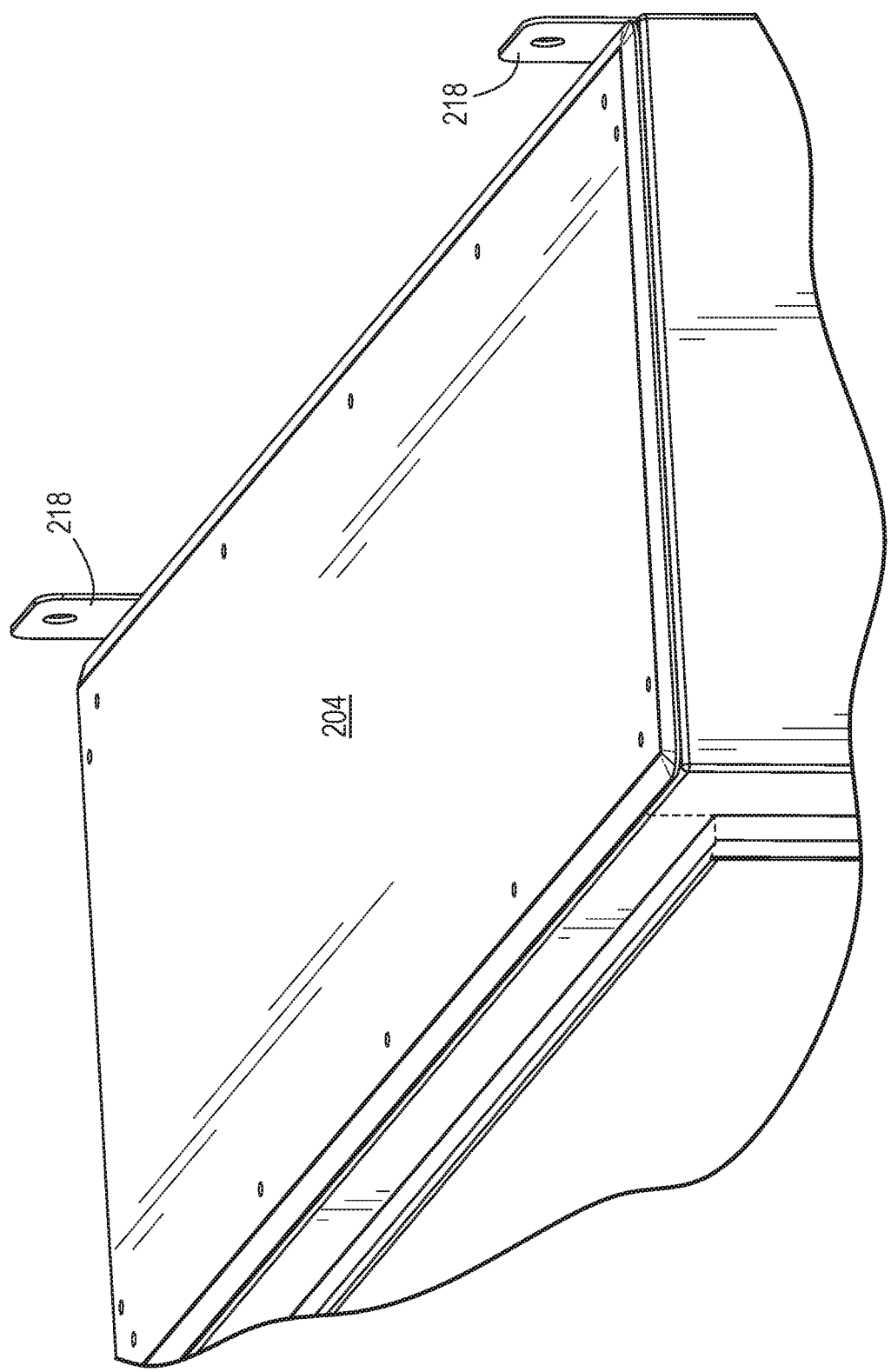
FIG. 16 is a second perspective view of the enclosure of FIG. 15.
Figure 17:
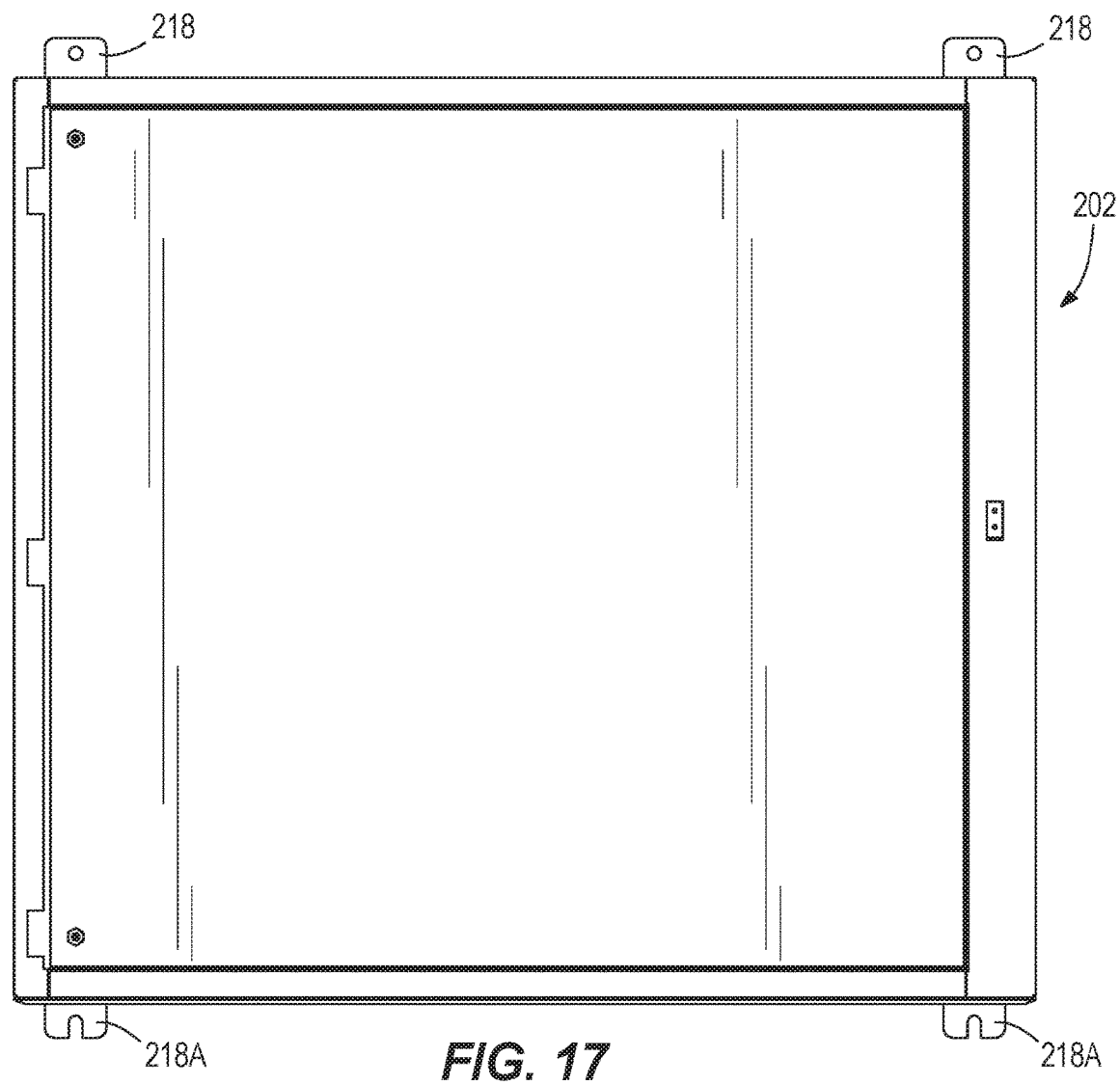
FIG. 17 is a front view of the enclosure of FIGS. 15 and 16, with a door and top cap removed.

The front, back and side panels of the body 102 can be integrally formed from a single material sheet, e.g., through stamping processes, as shown in FIG. 9. From a flat sheet of uniform material thickness, the body 102 can be stamped into a block letter C-shape formed by two separate, spaced sections or flanks of the front panel, the two side panels, and the back panel. Also integrally formed from the same sheet along with the front, back, and side panels are the lengthwise portions of the seal ridge 122 and the hinges 112. In addition, the upper and lower ledges 124, 126 are also integrally formed as bent extensions of the front, back, and side panels. In particular, the ledges 124, 126 are not separately formed and attached (e.g., by welding) to the front, back, and side panels of the body 102. However, the ledges 124, 126 themselves may be welded at corner miter joints to join various sections of folded-over material that combine to form each ledge 124, 126. It is also noted here that these corner welds at the upper and lower ledges 124, 126 may be the only welded joints on the body 102 in the form shown in FIG. 9, and thus, the body 102 is void of any lengthwise welds. In fact, the total length of the welds on the body 102 may be less than the perimeter length of one end of the enclosure 100 (i.e., 2W+2D). The enclosure 100 can be void of any single weld seam that spans the length L, void of any single weld seam that spans the width W, and void of any single weld seam that spans the depth D. Weld seams are indicated by dashed lines in FIGS. 3-6 and 8. Reducing the amount of welding in the construction of the enclosure 100 limits not only the time and labor necessary to produce the welds, but to subsequently dress the welds, e.g., by grinding, polishing, etc. In some constructions, the gaskets 120, 134, 136 can seal to meet the various NEMA, or UL standards, without any dressing of the welds. Rather, the manufacturing process may include application of the welds (e.g., by robotic welding, and optionally robotic laser welding), followed only by surface treatment (e.g., cleaning and/or coating, for example paint or powder coat) and assembly of the end caps 104, 106 and the door 108 to the body 102. Although the body 102 as shown in FIG. 9 includes no welds other than the corner welds at the upper and lower ledges 124, 126, additional welds may be used in connecting the separate portions of the as-stamped front panel with upper and lower cross members 144, 146. The total length of weld seams can be less than 100 cm (39.4 in), and even less than 90 cm (35.4 in) or less than 80 cm (31.5 in), for an enclosure having a volume of 20 liters (0.7 cu. ft.), 30 liters (1 cu. ft.), or more. Expanding one or more of the length L, width W, and depth D does not necessitate additional weld seam length since A) there are no lengthwise welds, B) the cross members 144, 146 can simply be extended as needed for a desired enclosure width, and C) the same four corner miter joints are needed at each end, regardless of the selected width and depth. The upper and lower cross members 144, 146 can have a similar or identical construction (see FIG. 14), and may be stamped sheet metal parts (e.g., of the same gauge as the body 102). The upper and lower cross members 144, 146 can each have multiple bends in the cross-section, thus forming the remaining portions of the seal ridge 122 surrounding the opening 110. The upper and lower cross members 144, 146 can further form the connecting segments of the upper and lower ledges 124, 126.

As shown in FIGS. 10A-12, the upper end cap 104 can be formed to include the mounting brackets 118 in some constructions. For example, the upper end cap 104 can be an integrally-stamped sheet, including the panel that closes the open end of the body 102 and the mounting brackets 118. In other constructions, the mounting brackets 118 can be formed separately from the end cap 104 and joined (e.g., by welding), to the end cap 104 and/or to the body 102. Returning to the construction of the upper end cap 104 as shown in FIGS. 10A-12, it can be seen that the shape is primarily flat throughout a majority central area of the cap 104. However, all of the peripheral edging of the upper end cap 104, around all four sides, is bent with a downward pitch angle α from a plane defined by a central portion of the upper end cap 104 (see FIGS. 10A and 10B). The angle α can be an acute angle, and in some constructions, at least 10 degrees and not more than 45 degrees. The peripheral edging can optionally be flush with the front, back, and side panels of the body 102, or may create an overhang with respect thereto. However, the upper end cap 104 does not extend down to lie directly on or against the front, back, and side panels. As shown in FIGS. 10A-12, the upper end cap 104 includes through holes for the fasteners 128, which may be rivets, or bolt-and-nut pairs, for example. However, through holes are not required in all constructions, as the upper end cap 104 can optionally have embedded (e.g., pressed-in) studs for the fasteners 128—for example, threaded stud fasteners 128 as shown in the lower end cap 106 of FIG. 13, which engage nuts to secure the upper end cap 104 to the body 102.

The lower end cap 106 as shown in FIG. 13 features the same pitched edges as the upper end cap 104, although not required in other constructions. The upper and lower end caps 104, 106 can be uniform and interchangeable in some constructions, whether having the through holes for separate fasteners or having the embedded studs. It is also noted that mounting brackets 118A are also optionally provided on the lower end cap 106. The mounting brackets 118A can have the same construction as the upper end cap mounting brackets 118 or an alternate construction, e.g., with slots or elongated holes vs. circular holes. In other constructions, the mounting brackets 118A can be formed separately from the end cap 106 and joined (e.g., by welding), to the end cap 106 and/or to the body 102. In some constructions, the mounting brackets 118, 118A of both end caps 104, 106 are used to mount the enclosure 100, while in other constructions, only one set of the mounting brackets are used.

Figure 18:
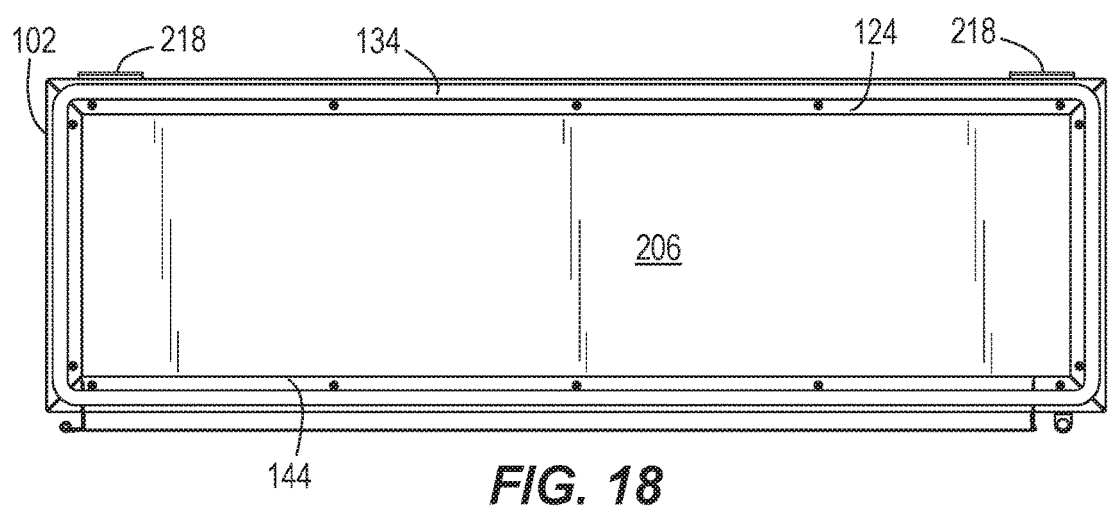
FIG. 18 is a top view of the enclosure of FIGS. 15 and 16, with the door and top cap removed.
Figure 19:
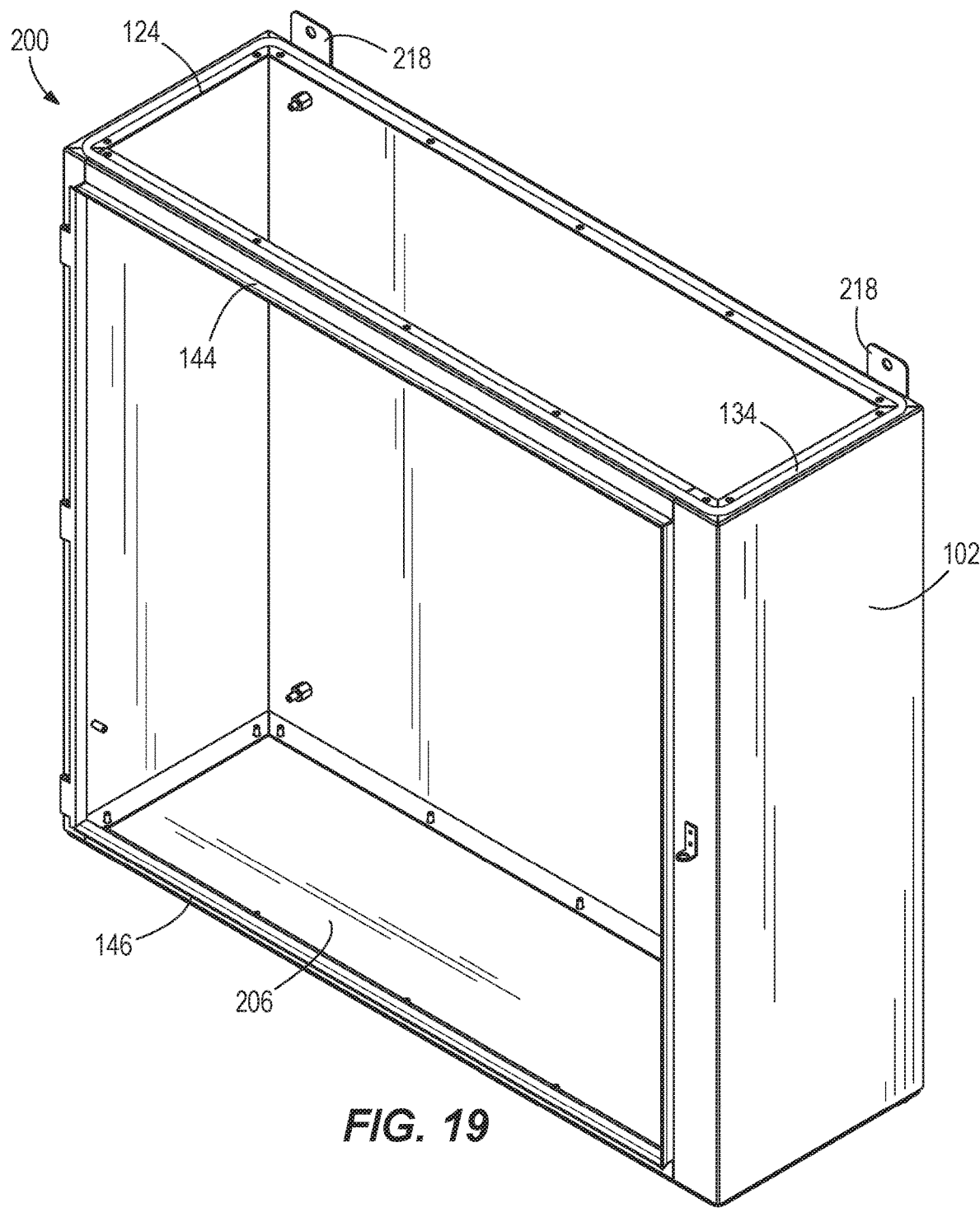
FIG. 19 is a perspective view of the enclosure of FIGS. 15 and 16, with the door and top cap removed.
Figure 20:
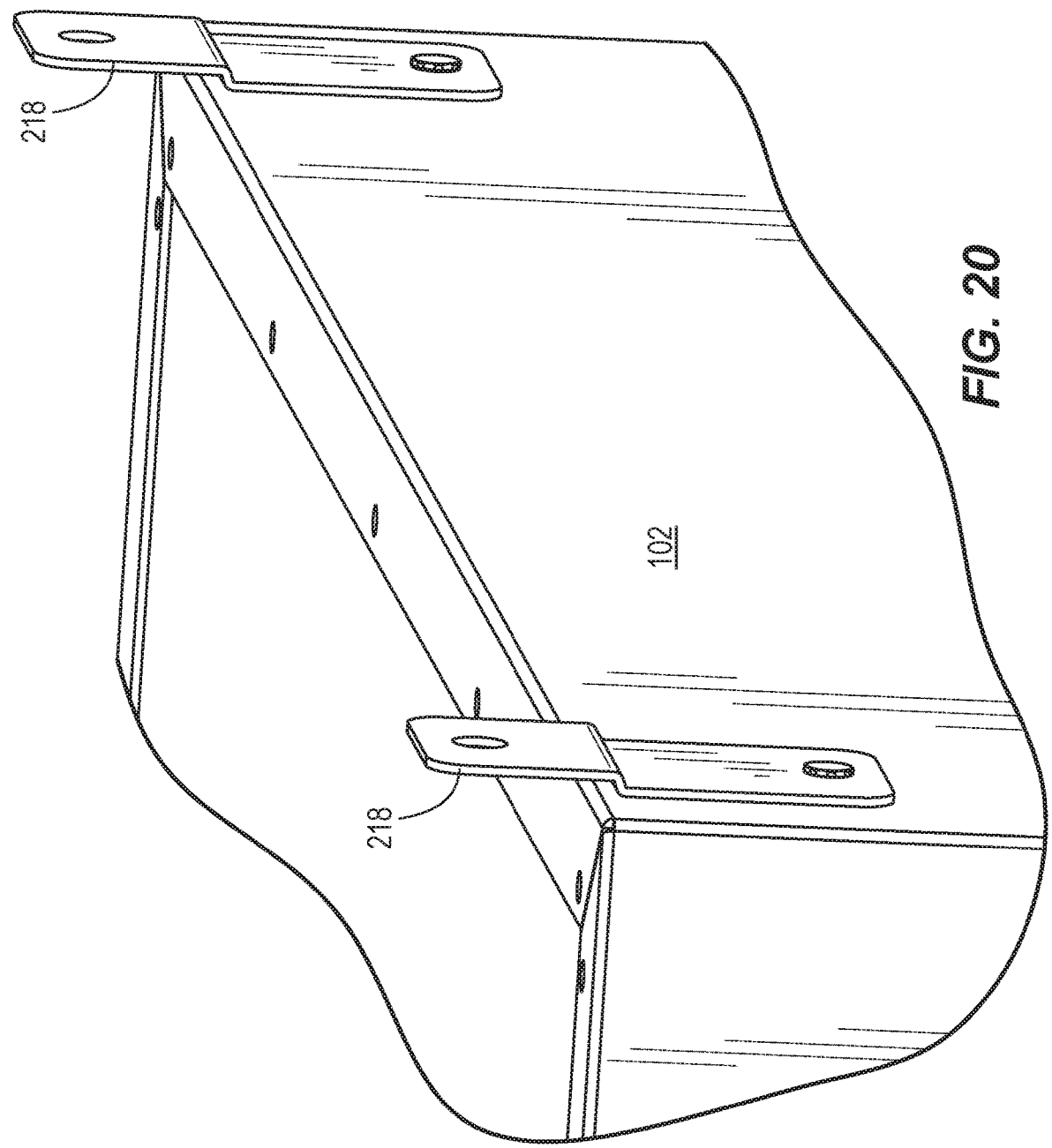
FIG. 20 is a perspective view of the upper mounting flanges on the enclosure body.
Figure 21:
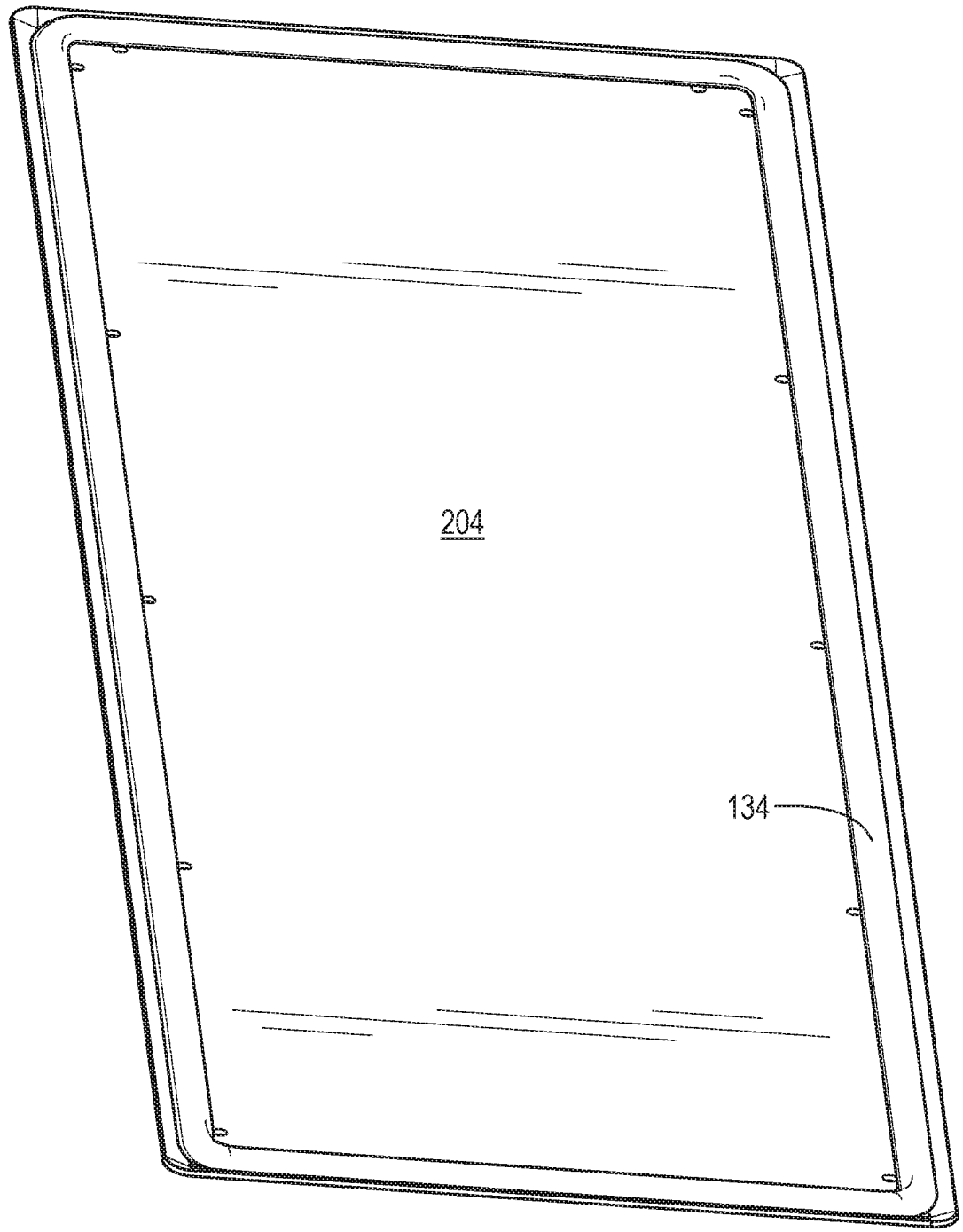
FIG. 21 is a perspective view of an upper end cap for use with an enclosure body.

With the exception of the configuration of the mounting brackets 218, 218A and the upper and lower end caps 204, 206, the enclosure 200 of FIGS. 15-21 is similar to the enclosure 100 as described above. The upper mounting brackets 218 are formed separately from the body stamping and later attached thereto, e.g., by welding and/or fastener(s) to the back body panel. Furthermore, a second set of lower mounting brackets 218A are provided to extend outwardly from the lower end of the body 102. The lower mounting brackets 218A feature elongated holes or open slots for mounting adjustability. The lower mounting brackets 218A, whether the same as or different from the upper mounting brackets 218, can be attached to the body stamping by welding and/or fastener(s), as with the upper mounting brackets 218. The upper and lower end caps 204, 206 feature no mounting flanges, but rather, each is simply a panel shaped and sized to close off the open end of the body 102. The upper end cap 204 can include fastener apertures as shown in FIG. 21, embedded fasteners, or combinations thereof, all of which are inboard of the gasket 134. The gasket 134 is shown in FIG. 21 as applied to the upper end cap 204, but the gasket 134 may alternately be applied to the upper ledge 124 as shown in FIGS. 18 and 19. The lower end cap 206 can take on any of the various features described for the upper and lower end caps 104, 106, 204, and may optionally be interchangeable with the upper end cap 204.

What is claimed is:

1. A protective enclosure for electrical components, the enclosure comprising:
a body formed at least in part by a single material sheet, the body defining a front opening,
a first end opening,
and a second end opening,
wherein the body includes a front panel,
a rear panel,
and two side panels,
wherein the single material sheet includes a first pair of bent corners between the front panel and the respective two side panels,
and the single material sheet further includes a second pair of bent corners between the rear panel and the respective two side panels such that the single material sheet extends, without welding, to form at least a portion of each one of the front panel, the rear panel, and the two side panels;
a door coupled to the body to selectively close the front opening;
a first end cap sealingly coupled to the body around the first end opening; and
a second end cap sealingly coupled to the body around the second end opening,
wherein the single material sheet is bent to form at least part of a first ledge that surrounds the first end opening and lies in a first plane perpendicular to the front, rear, and side panels,
wherein the single material sheet is bent to form at least part of a second ledge that surrounds the second end opening and lies in a second plane parallel to the first plane,
wherein a first plurality of mechanical fasteners extend through the first ledge to secure the first end cap to the body,
the first plurality of mechanical fasteners positioned exclusively inboard of a peripheral gasket between the first end cap and the first ledge,
wherein a second plurality of mechanical fasteners extend through the second ledge to secure the second end cap to the body,
the second plurality of mechanical fasteners positioned exclusively inboard of a peripheral gasket between the second end cap and the second ledge, and
wherein each of the peripheral gaskets is an addition-curing two-component system, applied with formed-in-place foam gasket technology.

2. The enclosure of claim 1, wherein the door is coupled to the body by at least one hinge formed in part integrally with the body and formed in part integrally with a sheet that forms the door.

3. The enclosure of claim 1, wherein the first plurality of mechanical fasteners include closed-end self sealing rivets.

4. The enclosure of claim 3, wherein the second plurality of mechanical fasteners include closed-end self sealing rivets.

5. The enclosure of claim 1, wherein at least one of the first and second plurality of mechanical fasteners includes a bolt-and-nut pair.

6. The enclosure of claim 1, wherein at least one of the first and second plurality of mechanical fasteners includes threaded studs and nuts.

7. The enclosure of claim 6, wherein the threaded studs are embedded into the first or second end cap.

8. The enclosure of claim 1, further comprising a gasket between the door and the front panel formed as an addition-curing two-component system,
applied with formed-in-place foam gasket technology.

9. The enclosure of claim 1, wherein the only welds in the body between the first and second ends are at the top and bottom edges of the front opening where an upper cross member and a lower cross member are welded into place to connect two spaced lateral flanks of the front panel.

10. The enclosure of claim 1, further comprising at least one mounting bracket.

11. The enclosure of claim 10, wherein the at least one mounting bracket is integrally formed with one of the first and second end caps.

12. The enclosure of claim 1, wherein the first end cap includes a central portion and peripheral edge portions extending around the central portion to define a perimeter of the first end cap,
wherein the edge portions are pitched from the central portion by bending the edge portions by an acute angle from a plane defined by the central portion.

13. The enclosure of claim 12, wherein the angle is not more than 45 degrees.

14. The enclosure of claim 1, wherein the first ledge continuously surrounds an entire periphery of the first end opening,
and the second ledge continuously surrounds an entire periphery of the second end opening.

15. The enclosure of claim 1, further comprising a cross member formed separately from the single material sheet and welded to the single material sheet between two spaced lateral flanks of the single material sheet.

16. The enclosure of claim 15, wherein the cross member includes a part forming a portion of the front panel,
a part forming a portion of the first ledge,
and a bend therebetween.

17. The enclosure of claim 15, wherein the cross member is a first cross member,
the enclosure further comprising a second cross member formed separately from the single material sheet and welded to the single material sheet between the two spaced lateral flanks of the single material sheet.

18. The enclosure of claim 17, wherein the first cross member includes a part forming a portion of the front panel,
a part forming a portion of the first ledge,
and a bend therebetween,
and wherein the second cross member includes a part forming a portion of the front panel,
a part forming a portion of the second ledge,
and a bend therebetween.

19. A protective enclosure for electrical components, the enclosure comprising:
a body formed at least in part by a single material sheet, the body defining a front opening,
a first end opening,
and a second end opening,
wherein the body includes a front panel,
a rear panel,
and two side panels,
wherein the single material sheet includes a first pair of bent corners between the front panel and the respective two side panels,
and the single material sheet further includes a second pair of bent corners between the rear panel and the respective two side panels such that the single material sheet extends, without welding, to form at least a portion of each one of the front panel, the rear panel, and the two side panels;
a door coupled to the body to selectively sealingly close the front opening;
a first end cap sealingly coupled to the body around the first end opening to close the first end opening; and
a second end cap sealingly coupled to the body around the second end opening to close the second end opening,
wherein the single material sheet is bent to form at least part of a first ledge that surrounds the first end opening and lies in a first plane perpendicular to the front, rear, and side panels,
wherein the single material sheet is bent to form at least part of a second ledge that surrounds the second end opening and lies in a second plane parallel to the first plane,
wherein the first end cap includes a central portion and an edge portion extending around the central portion to define a perimeter of the first end cap,
wherein the edge portion is pitched at an acute angle from the central portion, and
wherein a peripheral gasket is provided between the first end cap and the first ledge at the first end opening of the body,
the gasket being positioned peripherally outboard of a plurality of mechanical fasteners securing the first end cap to the body,
wherein the gasket is an addition-curing two-component system, applied with formed-in-place foam gasket technology.

* * * * *